United States Patent [19]
Kasai

[11] Patent Number: 5,410,165
[45] Date of Patent: Apr. 25, 1995

[54] THIN FILM TRANSISTOR WITH CONDUCTIVE LAYER AND STATIC RAM WITH THIN FILM TRANSISTOR

[75] Inventor: Kunihiro Kasai, Yokohama, Japan

[73] Assignee: Kabushiki Kaisha Toshiba, Kawasaki, Japan

[21] Appl. No.: 66,888

[22] Filed: May 25, 1993

[30] Foreign Application Priority Data

May 29, 1992 [JP] Japan .................. 4-139312

[51] Int. Cl.$^6$ ........................... H01L 27/02
[52] U.S. Cl. ........................ 257/67; 257/60; 257/351; 257/903
[58] Field of Search ................. 257/57, 60, 67, 347, 257/351, 352, 365, 366, 903

[56] References Cited

U.S. PATENT DOCUMENTS

| | | | |
|---|---|---|---|
| 4,748,485 | 5/1988 | Vasudev | 257/351 |
| 4,984,040 | 1/1991 | Yap | 257/60 |
| 4,984,041 | 1/1991 | Hack et al. | 257/60 |

FOREIGN PATENT DOCUMENTS

| | | |
|---|---|---|
| 0382165 | 8/1990 | European Pat. Off. |
| 0403279 | 12/1990 | European Pat. Off. |
| 0443549 | 8/1991 | European Pat. Off. |
| 4125970 | 4/1992 | Japan |

OTHER PUBLICATIONS

1991 Symposium on VLSI Technology. Digest of Technical Papers, pp. 23–24 —K. Tsutsumi et al. "A High-Performance SRAM Memory Cell with LDD-TFT Loads".

1976 IEEE International Solid-State Circuits Conference. Digest of Technical Papers, pp. 58–59 —Michael R. Splinter et al. "High Voltage SOS/MOS Devices and Circuit Elements".

*Primary Examiner*—Ngan V. Ngo
*Attorney, Agent, or Firm*—Spensley Horn Jubas & Lubitz

[57] ABSTRACT

A thin film transistor includes a semiconductor thin film formed with a source region and a drain region at opposite end portions thereof and having an offset region near at the drain region, a gate electrode formed above the region between the source region and the offset region of the semiconductor thin film, with a gate insulating film being interposed, and a conductive layer formed above the gate electrode or under the semiconductor thin film, with an insulating film being interposed, the conductive layer being applied with generally the same potential as the gate electrode, wherein the resistance value of the offset region is controlled by the potential of the conductive layer. The gate electrode may be formed under the semiconductor thin film. In this case, the conductive layer is formed above the semiconductor thin film or under the gate electrode, with an insulating film being interposed. An SRAM is also provided which uses a thin film transistor constructed as above.

4 Claims, 6 Drawing Sheets

THIN FILM TRANSISTOR WITH CONDUCTIVE LAYER AND STATIC RAM WITH THIN FILM TRANSISTOR

BACKGROUND OF THE INVENTION

The present invention relates to a thin film transistor and a static RAM using a thin film transistor.

In the recent semiconductor technology, there is known a thin film transistor of the type that it is formed on an interlayer insulating film covering elements formed on the surface of a semiconductor substrate.

Figure 9:
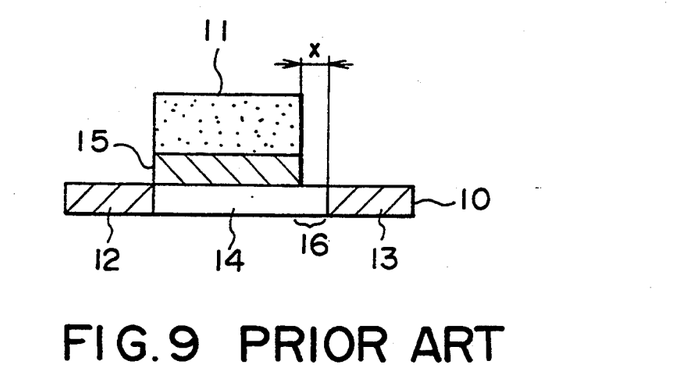
FIG. 9 is an elevational cross section showing the structure of a conventional thin film transistor.

FIG. 9 is a cross sectional view showing the structure of a thin film transistor as a load transistor of an SRAM. A semiconductor thin film 10 is formed on an interlayer insulating film (not shown) on a semiconductor substrate (not shown). A source region 12 and a drain region 13 are formed on opposite end portions of the semiconductor thin film 10, and a channel region 14 is formed between the source and drain regions. On the channel region 14, there is formed a gate oxide film 15 on which a gate electrode 11 is formed.

Figure 10:
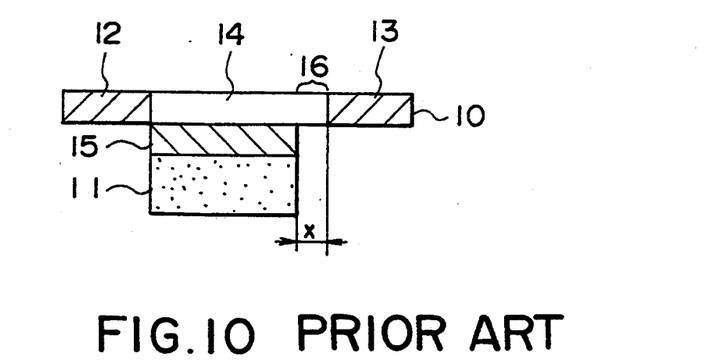
FIG. 10 is an elevational cross section showing the structure of another conventional thin film transistor.

A thin film transistor shown in FIG. 10 has its gate electrode 11 and gate oxide film 15 formed under the semiconductor thin film 10, and is symmetrical to the device shown in FIG. 9 relative to the semiconductor thin film 10.

An offset region 16 having a width x is provided between each drain region 13 and gate electrode 11. This offset region 16 is provided to reduce a standby current to be consumed during an inactive state of the thin film transistor. The provision of such an offset region 16 weakens the electric field between the drain region 13 and gate electrode 11, reducing the leakage current.

The offset region 16 cannot be controlled by a voltage applied between the drain region 13 and gate region 11. As a result, the offset region 16 functions as a resistor during an active state of the thin film transistor. This causes the drive current of the thin film transistor to lower, and the variation of resistance values of offset regions may change the characteristics of thin film transistors.

SUMMARY OF THE INVENTION

It is therefore an object of the present invention to provide a thin film transistor capable of reducing the standby current during an inactive state, supplying a large drive current during an active state, and suppressing the variation of characteristics, and to provide an SRAM using such a thin film transistor.

According to one aspect of the present invention, there is provided a thin film transistor comprising: a semiconductor thin film formed with a source region and a drain region at opposite end portions thereof and having an offset region near at the drain region; a gate electrode formed above the region between the source region and the offset region of the semiconductor thin film, with a gate insulating film being interposed; and a conductive layer formed above the gate electrode or under the semiconductor thin film, with an insulating film being interposed, the conductive layer being applied with generally the same potential as the gate electrode, wherein the resistance value of the offset region is controlled by the potential of the conductive layer.

The resistance value of the offset region, formed near at the drain region of the semiconductor thin film between the drain region and gate electrode, is controlled by the conductive layer with the potential generally the same as the gate electrode being applied. In the inactive state of the thin film transistor, the offset region weakens the electric field between the drain region and gate electrode, suppressing the leakage current. In the active state, the resistance value of the offset region is lowered, obtaining a large drive current.

The gate electrode may be formed under the semiconductor thin film. In this case, the conductive layer is formed above the semiconductor thin film or under the gate electrode, with an insulating film being interposed.

According to another aspect of the present invention, there is provided a static RAM having a first inverter including a first load transistor and a first drive transistor and a second inverter including a second load transistor and a second drive transistor, wherein each of the first and second load transistors comprises: a semiconductor thin film formed with a source region and a drain region at opposite end portions thereof and having an offset region near at the drain region; and a gate electrode formed above or under the region between the source region and the offset region of the semiconductor thin film, with a gate insulating film being interposed, and wherein the offset region of the first load transistor is positioned above the gate electrode of the first drive transistor, with an insulating film being interposed, the resistance value of the offset region is controlled by the potential of the gate electrode of the first drive transistor, the offset region of the second load transistor is positioned above the gate electrode of the second drive transistor, with an insulating film being interposed, and the resistance value of the offset region is controlled by the potential of the gate electrode of the second drive transistor.

In the SRAM having the first and second load transistors made of thin film transistors, the potential of the gate electrode of the first thin film transistor is the same as the gate electrode of the first drive transistor or the drain region of the second drive transistor, and the potential of the gate electrode of the second thin film transistor is the same as the gate electrode of the second drive transistor or the drain region of the first drive transistor. The offset region of the first thin film transistor positions above the gate electrode of the first drive transistor or the drain region of the second drive transistor, and the offset region of the second thin film transistor positions above the gate electrode of the second drive transistor or the drain region of the first drive transistor. Accordingly, the resistance value of the offset region can be controlled without providing an additional conductive layer.

The offset region of the first load transistor may be positioned above the drain region of the second drive transistor, with an insulating film being interposed, and the resistance value of the offset region is controlled by the potential of the drain region of the second drive transistor. The offset region of the second load transistor may be positioned above the drain region of the first drive transistor, with an insulating film being interposed, and the resistance value of the offset region is controlled by the potential of the drain region of the first drive transistor.

DESCRIPTION OF THE PREFERRED EMBODIMENTS

Figure 1:
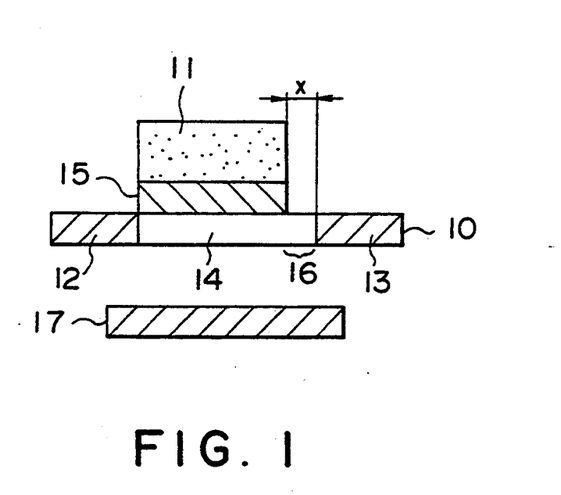
FIG. 1 is an elevational cross section showing the structure of a thin film transistor according to a first embodiment of the present invention.

Preferred embodiments of the present invention will be described with reference to the accompanying drawings. FIG. 1 is a cross sectional view showing the structure of a thin film transistor according to the first embodiment. An interlayer insulating film (not shown) is formed on a semiconductor substrate (not shown). On this interlayer insulating film, a semiconductor thin film 10 is formed. This semiconductor thin film 10 is formed by depositing amorphous silicon and growing it into polysilicon in a solid phase, and has a film thickness of about 300 angstroms.

A source region 12 and a drain region 13 are formed in the semiconductor thin film 10 at its opposite end portions. On a channel region 14 between the source and drain regions 12 and 13, there is formed a gate oxide film 15 having a film thickness of about 300 angstroms on which film a gate electrode 11 having a thickness of about 1000 angstroms is formed. Between the drain region 13 and gate electrode 11, an offset region 16 having a width x is provided as with a conventional thin film transistor. A conductive layer 17 is formed under the semiconductor thin film 10, with an insulating film (not shown) being interposed therebetween. It is necessary for the distance between the conductive layer 17 and semiconductor thin film 10 to be set greater than the film thickness of the gate oxide film 15.

The thin film transistor constructed as above operates as follows. In the inactive state, because of the provision of the offset region 16, the electric field between the drain region 13 and gate electrode 11 weakens similarly to the conventional case, thereby reducing the leakage current. Since the conductive layer 17 is positioned more remotely from the semiconductor thin film 10 than the gate electrode 11, the effect of the conductive layer 17 is small even if the conductive layer 17 were applied with the same potential as the gate electrode 11.

In the active state, the potential of the conductive layer 17 is set to the same potential as the gate electrode 11. With this setting, the offset region 16 is controlled by the conductive layer 17 so that this region operates in the same manner as the channel region 14 under the gate electrode 11. The resistance of the offset region 16 lowers accordingly, preventing the drive current from being reduced. In addition, the variation of resistance values of the offset regions 16 is suppressed, maintaining the characteristics of thin film transistors with less change.

Figure 2:
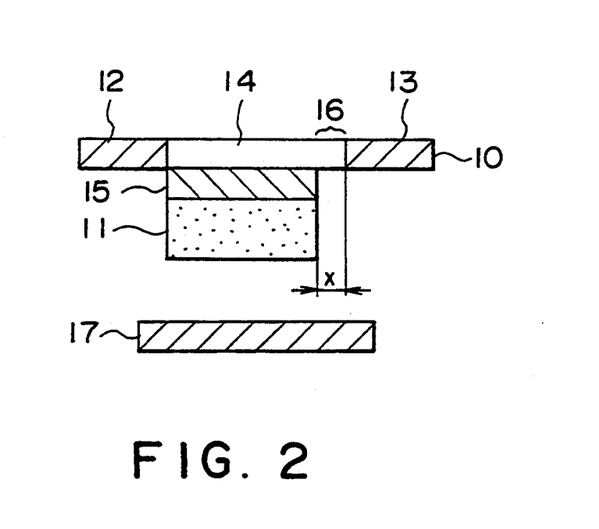
FIG. 2 is an elevational cross section showing the structure of a thin film transistor according to a second embodiment of the present invention.

In the first embodiment, the gate electrode 11 is formed above the semiconductor thin film 10. In contrast, the gate electrode 11 of the second embodiment shown in FIG. 2 is formed under the semiconductor thin film 10. Also in the second embodiment, the potential of the offset region 16 between the drain region 13 and gate electrode 11 is controlled by the conductive layer 17 in the active state. Therefore, the resistance of the offset region 16 lowers, preventing the lowering of the drive current and the variation of characteristics of thin film transistors.

Figure 3:
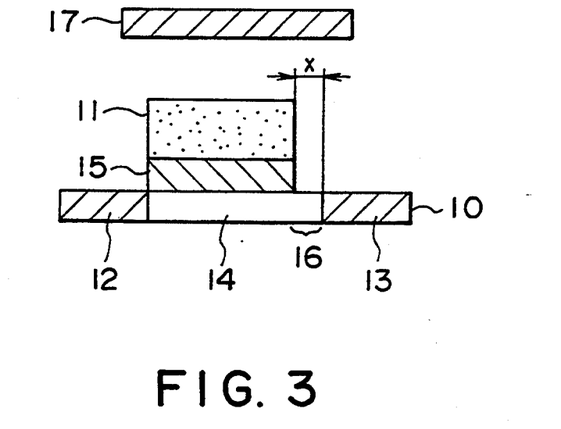
FIG. 3 is an elevational cross section showing the structure of a thin film transistor according to a third embodiment of the present invention.
Figure 4:
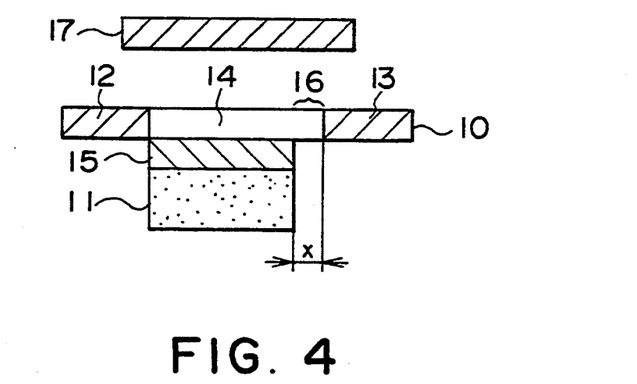
FIG. 4 is an elevational cross section showing the structure of a thin film transistor according to a fourth embodiment of the present invention.

In the first and second embodiments, the conductive layer 17 is formed under the semiconductor thin film 10. In contrast, in the third embodiment shown in FIG. 3 and fourth embodiment shown in FIG. 4, the conductive layer 17 is formed above the semiconductor thin film 10. In the third embodiment, the gate electrode 11 is positioned above the semiconductor thin film 10, and in the fourth embodiment, the gate electrode 11 is positioned under the semiconductor thin film 10. In both the embodiments, in the active state, the conductive layer 17 is applied with the same potential as the gate electrode 11 to control the offset region 16 and reduce the resistance thereof.

In the first to fourth embodiments described above, the positions of the gate electrodes 11 relative to the semiconductor thin films 10 differ from each other, and the positions of the conductive layers 17 relative to the semiconductor thin film 10 differ from each other. In any one of the first to fourth embodiments, the resistance of the offset region 16 can be reduced in the active state.

Figure 7:
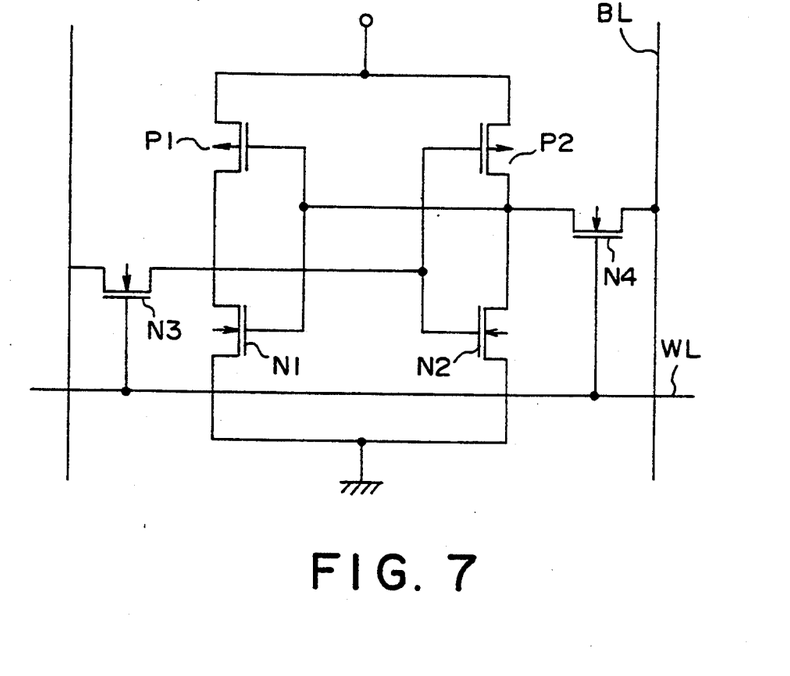
FIG. 7 is a circuit diagram of an SRAM having load transistors made of thin film transistors according to the present invention.

Next, an SRAM of the fifth embodiment according to the present invention will be described. In this embodiment, a thin film transistor is used as a load transistor for each cell of the SRAM. As shown in FIG. 7, an SRAM cell has two inverters, one being formed by a P channel transistor P1 and an N channel transistor N1 and the other being formed by a P channel transistor P2 and an N channel transistor N2. The P channel transistors P1 and P2 as the load transistors are made of thin film transistors. As shown from FIG. 7, the gate electrode of the P channel transistor P1 is applied with the same potential as the gate electrode of the N channel transistor N1 operating as the drive transistor. The gate electrode of the N channel transistor N1 is used as the conductive layer of the P channel transistor P1 of the thin film transistor. Use of the gate electrode of the other transistor as the conductive layer without forming an additional conductive layer, simplifies the device structure and the manufacturing processes.

Figure 5:
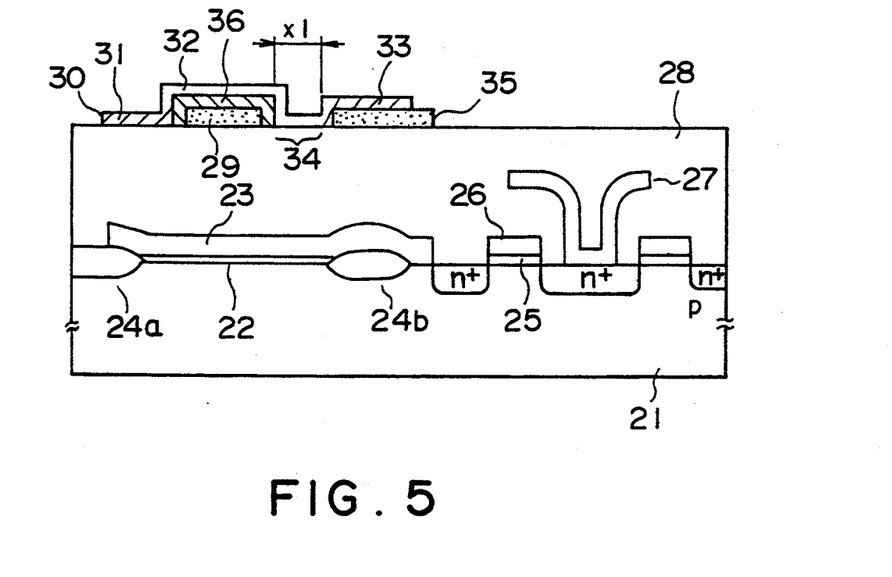
FIG. 5 is an elevational cross section showing the structure of an SRAM according to a fifth embodiment of the present invention.

FIG. 5 is an elevational cross section showing the structure of an SRAM according to the fifth embodiment of the present invention. On the surface of a semiconductor substrate 21, field oxide films 24a and 24b are formed. Between the field oxide films 24a and 24b, a gate oxide film 22 is formed on which a gate electrode 23 is formed. Also formed are gate oxide films 25 and gate electrodes 26 for N channel transistors N3 and N4 operating as the transfer transistors. A bit line contact 27 for a bit line BL is connected to the source region of the transfer transistor.

An interlayer insulating film 28 having a thickness from 4000 to 7000 angstroms is formed on the semiconductor substrate 21. A gate electrode 29 and a gate oxide film 36 of the P channel transistor P1 are formed on the surface of the interlayer insulating film, in this order from the bottom. A semiconductor thin film 30 is formed on the surfaces of the gate electrode 29, nearby interlayer insulating film 28, and gate electrode 35 of the other P channel load transistor P2. A source region 31 and a drain region 33 are formed in the semiconductor thin film 30 at opposite end portions of the film. A channel region is provided above the gate electrode 29 between the source region 31 and drain region 33. An offset region 34 having a width x is provided between the gate electrode 29 and drain region 33. The offset region 34 positions above the gate electrode 23 of the N channel transistor N1. As described previously, the gate electrode 23 is applied with the same potential as the gate electrode 29 of the thin film transistor, the gate electrode 23 having the same function as the conductive layer 17 of the first to fourth embodiments. In the active state of the thin film transistor, therefore, the resistance of the offset region 34 is controlled by the gate electrode 23 of the N channel transistor N1, and so the offset region 34 provides the same function as the channel region 32. The resistance of the offset region 34 therefore declines, preventing the lowering of the drive current and the variation of characteristics of the thin film transistors.

As shown in FIG. 7, the potential of the gate electrode of the P channel transistor P1 formed as the thin film transistor is the same as not only the gate electrode of the N channel transistor N1 but also the drain region of the N channel transistor N2 of the other inverter. In consideration of this, in an SRAM of the sixth embodiment according to the present invention, the offset region of a thin film transistor is positioned above the drain region of an N channel transistor N2.

Figure 6:
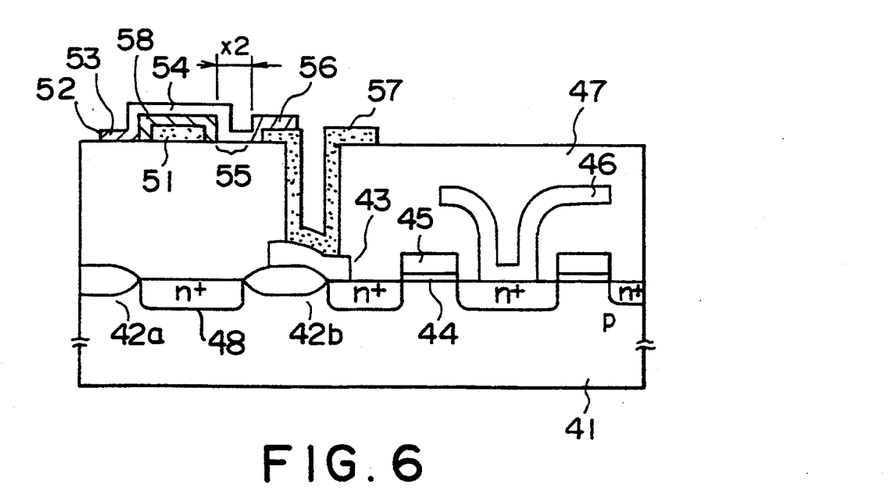
FIG. 6 is an elevational cross section showing the structure of an SRAM according to a sixth embodiment of the present invention.

FIG. 6 is an elevational cross section showing the structure of an SRAM of the sixth embodiment. On the surface of a semiconductor substrate 41, field oxide films 42a and 42b are formed. Between the field oxide films 42a and 42b, a drain region 48 of the N channel transistor N2 is formed. Also formed as in the fifth embodiments are gate oxide films 44 and gate electrodes 45 for N channel transistors N3 and N4 operating as the transfer transistors, and a bit line contact 46.

An interlayer insulating film 47 is formed on the surface of the semiconductor substrate 41. A gate electrode 51 and a gate oxide film 58 of the P channel transistor P1 as the thin film transistors are formed on the interlayer insulating film 47, in this order from the bottom. A semiconductor thin film 52 is formed on the surfaces of the device. A source region 52 and a drain region 56 are formed in the semiconductor thin film 52 at opposite end portions of the film.

The drain region 56 is electrically connected to the gate electrode 57 of the other P channel load transistor P2. The gate electrode 57 is connected to the gate electrode 43 of the N channel transistor N2.

A channel region 54 in the semiconductor thin film 52 is positioned above the gate electrode 51. Between the gate electrode 51 and drain region 56, there is provided an offset region 55. The offset region 55 is positioned above the drain region 48 of the N channel transistor N2. In the active state of the thin film transistors, therefore, the drain region operates as the conductive layer so that the resistance of the offset region 55 declines, preventing the lowering of the drive current and the variation of characteristics of the thin film transistors.

In the fifth and sixth embodiments, the P channel transistor P1 of the two load transistors has been used for the description of the embodiments. The other P channel transistor P2 can also be configured in the same manner. Namely, the offset region is positioned above the gate electrode of the N channel transistor N2 or the drain region of the N channel transistor N1.

Figure 8:
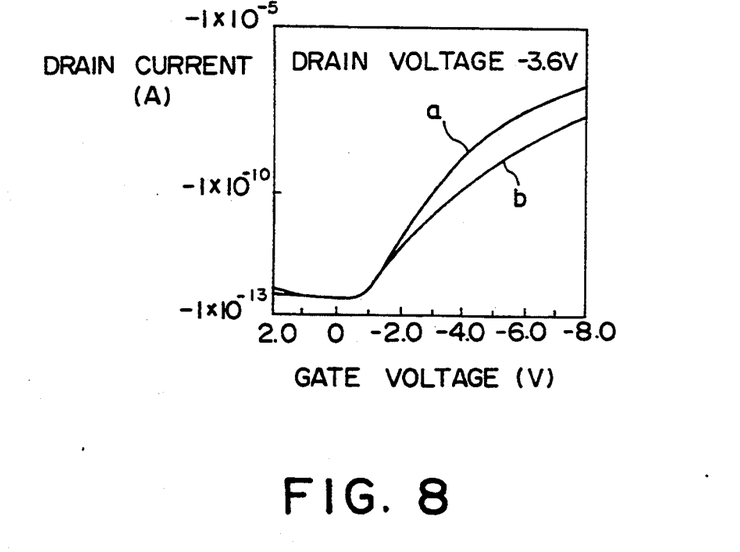
FIG. 8 is a graph showing the drive current of the thin film transistor of the second embodiment of the present invention, as compared with the drive current of a conventional thin film transistor.

FIG. 8 shows the results of comparison between the drive current of the thin film transistor of the second embodiment shown in FIG. 2 and the drive current of the conventional thin film transistor shown in FIG. 10. The dimensions of the second embodiment thin film and the conventional thin film were both set such that the gate electrode 11 had a width 0.7 $\mu$m and a length 1.0 $\mu$m and the offset region 16 had a width x of 0.6 $\mu$m. The conductive layer 17 for the second embodiment thin film transistor was made of tungsten polycide.

The drive current indicated by a curve a of the second embodiment is larger than that indicated by a curve b of the conventional thin film transistor. It was verified that a large drive current was obtained by controlling the offset region between the drain region and gate electrode by the conductive layer.

Figure 11:
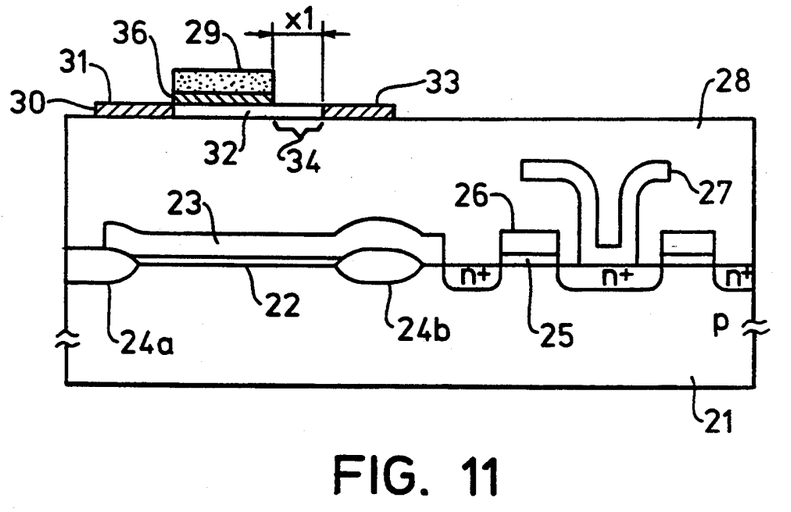
FIG. 11 is an elevational cross section showing the structure of an SRAM according to the present invention.
Figure 12:
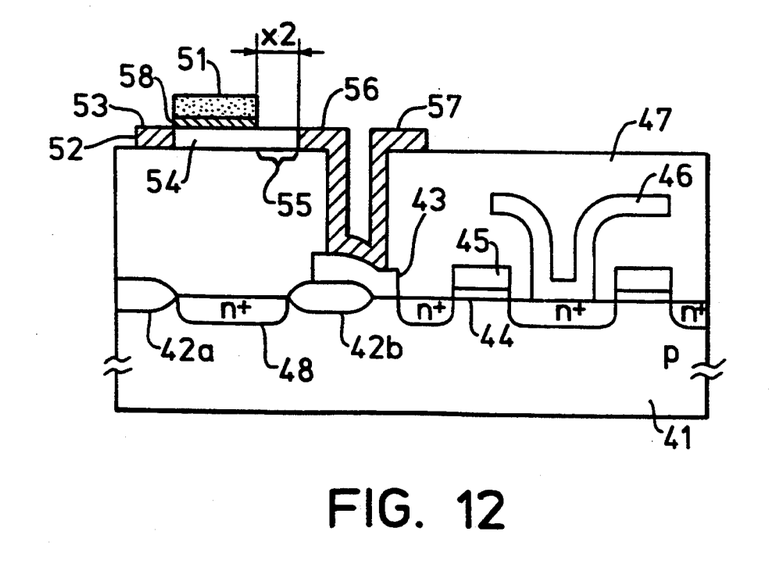
FIG. 12 is an elevational cross section showing the structure of an SRAM according to the present invention.

FIGS. 11 and 12 are elevational cross section views showing the structure of SRAMs according to the present invention. FIG. 11 is similar to FIG. 5 with the exception that the FIG. 5 SRAM incorporates the thin film transistor illustrated in FIG. 2, while the FIG. 11 SRAM incorporates the thin film transistor of FIG. 1. FIG. 12 is similar to FIG. 6 with the exception that the FIG. 6 SRAM incorporates the thin film transistor illustrated in FIG. 2, while the FIG. 12 SRAM incorporates the thin film transistor of FIG. 1.

The above-described embodiments are illustrative only, and are not intended to limit the scope of the present invention. The conductive layer of the invention may be made of any other conductive material such as polysilicon silicide, polycide, and metal, as with the material for the gate electrode.

What is claimed is:

1. A static RAM having a first inverter including a first load transistor and a first drive transistor and a second inverter including a second load transistor and a second drive transistor, wherein each of said first and second load transistors comprises:

a semiconductor thin film formed with a source region and a drain region at opposite end portions thereof and having an offset region adjacent to said drain region; and a gate electrode formed under a region between said source region and said offset region of said semiconductor thin film, with a gate insulating film being interposed between said semiconductor thin film and said gate electrode, and wherein said offset region of said first load transistor is positioned above a gate electrode of said first drive transistor, with an insulating film being interposed between said gate electrode of said first drive transistor and said offset region of said first load transistor, the resistance value of said offset region is controlled by the potential of said gate electrode of said first drive transistor, said offset region of said second load transistor is positioned above a gate electrode of said second drive transistor, with an insulating film being interposed between said gate electrode of said second drive transistor and said offset region of said second load transistor, and the resistance value of said offset region is controlled by the potential of said gate electrode of said second drive transistor.

2. A static RAM having a first inverter including a first load transistor and a first drive transistor and a second inverter including a second load transistor and a second drive transistor, wherein each of said first and second load transistors comprises:

a semiconductor thin film formed with a source region and a drain region at opposite end portions thereof and having an offset region adjacent to said drain region; and a gate electrode formed under a region between said source region and said offset region of said semiconductor thin film, with a gate insulating film being interposed between said semiconductor thin film and said gate electrode, and wherein said offset region of said first load transistor is positioned above a drain region of said second drive transistor, with an insulating film being interposed between said drain region of said second drive transistor and said offset region of said first load transistor, the resistance value of said offset region is controlled by the potential of said drain region of said second drive transistor, said offset region of said second load transistor is positioned above a drain region of said first drive transistor, with an insulating film being interposed between said drain region Of said first drive transistor and said offset region of said second load transistor, and the resistance value of said offset region is controlled by the potential of said drain region of said first drive transistor.

3. A static RAM having a first inverter including a first load transistor and a first drive transistor and a second inverter including a second load transistor and a second drive transistor, wherein each of said first and second load transistors comprises:

a semiconductor thin film formed with a source region and a drain region at opposite end portions thereof and having an offset region adjacent to said drain region; and a gate electrode formed above a region between said source region and said offset region of said semiconductor thin film, with a gate insulating film being interposed between said semiconductor thin film and said gate electrode, and wherein said offset region of said first load transistor is positioned above a gate electrode of said first drive transistor, with an insulating film being interposed between said gate electrode of said first drive transistor and said offset region of said first load transistor, the resistance value of said offset region is controlled by the potential of said gate electrode of said first drive transistor, said offset region of said second load transistor is positioned above a gate electrode of said second drive transistor, with an insulating film being interposed between said gate electrode of said second drive transistor and said offset region of said second load transistor, and the resistance value of said offset region is controlled by the potential of said gate electrode of said second drive transistor.

4. A static RAM having a first inverter including a first load transistor and a first drive transistor and a second inverter including a second load transistor and a second drive transistor, wherein each of said first and second load transistors comprises:

a semiconductor thin film formed with a source region and a drain region at opposite end portions thereof and having an offset region adjacent to said drain region; and a gate electrode formed above a region between said source region and said offset region of said semiconductor thin film, with a gate insulating film being interposed between said semiconductor thin film and said gate electrode, and wherein said offset region of said first load transistor is positioned above a drain region of said second drive transistor, with an insulating film being interposed between said drain region of said second drive transistor and said offset region of said first load transistor, the resistance value of said offset region is controlled by the potential of said drain region of said second drive transistor, said offset region of said second load transistor is positioned above a drain region of said first drive transistor, with an insulating film being interposed between said drain region of said first drive transistor and said offset region of said second load transistor, and the resistance value of said offset region is controlled by the potential of said drain region of said first drive transistor.

* * * * *